United States Patent
Okamura et al.

(10) Patent No.: US 11,418,686 B2
(45) Date of Patent: Aug. 16, 2022

(54) IMAGE PICKUP MODULE AND IMAGE PICKUP DEVICE

(71) Applicant: HITACHI AUTOMOTIVE SYSTEMS, LTD., Hitachinaka (JP)

(72) Inventors: Masayuki Okamura, Tokyo (JP); Akihiro Yamaguchi, Tokyo (JP); Chiemi Kubota, Tokyo (JP); Hidenori Shinohara, Hitachinaka (JP); Kenichi Takeuchi, Hitachinaka (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 630 days.

(21) Appl. No.: 16/097,094

(22) PCT Filed: Apr. 13, 2017

(86) PCT No.: PCT/JP2017/015165
§ 371 (c)(1),
(2) Date: Oct. 26, 2018

(87) PCT Pub. No.: WO2017/188013
PCT Pub. Date: Nov. 2, 2017

(65) Prior Publication Data
US 2021/0227108 A1 Jul. 22, 2021

(30) Foreign Application Priority Data

Apr. 27, 2016 (JP) .............................. JP2016-089030

(51) Int. Cl.
*H04N 5/225* (2006.01)
*G02B 7/02* (2021.01)
(Continued)

(52) U.S. Cl.
CPC ........... *H04N 5/2254* (2013.01); *G02B 7/025* (2013.01); *G02B 27/62* (2013.01); *G03B 30/00* (2021.01);
(Continued)

(58) Field of Classification Search
CPC .. H04N 5/2254; H04N 5/2253; H04N 5/2251; H04N 5/2252; H04N 5/225;
(Continued)

(56) References Cited

U.S. PATENT DOCUMENTS 5,359,190 A * 10/1994 O'Regan ................ G02B 7/022
250/214.1
2003/0057426 A1* 3/2003 Miyazaki ............. H04N 5/2254
257/88

(Continued)

FOREIGN PATENT DOCUMENTS

| JP | 2006-098497 A | 4/2006 |
| JP | 2007-174358 A | 7/2007 |

(Continued)

OTHER PUBLICATIONS

Extended European Search Report dated Nov. 20, 2019 for the European Patent Application No. 17789299.9.

(Continued)

*Primary Examiner* — Albert H Cutler
(74) *Attorney, Agent, or Firm* — Volpe Koenig

(57) ABSTRACT

An imaging module includes: a substrate on which an imaging element is mounted and in which a through-hole is formed; a holding section that has a support pin inserted into the through-hole in such a manner that the support pin penetrates the through-hole and that holds an optical system forming a subject image on the imaging element; and an adhesive that is provided in the through-hole and that fixes the substrate to the support pin, and at least a tip end portion of the support pin has a tapered shape from a root side of the support pin toward a tip end of the support pin.

7 Claims, 9 Drawing Sheets

(51) Int. Cl.
  *G02B 27/62* (2006.01)
  *G03B 30/00* (2021.01)
  *H01L 27/146* (2006.01)
  *G02B 7/00* (2021.01)
  *G03B 17/02* (2021.01)

(52) U.S. Cl.
  CPC ..... *H01L 27/14618* (2013.01); *H04N 5/2253* (2013.01)

(58) Field of Classification Search
  CPC ... H01L 27/14618; G03B 30/00; G03B 17/02; G02B 7/025; G02B 27/62; G02B 13/001; G02B 7/004
  See application file for complete search history.

(56) References Cited

U.S. PATENT DOCUMENTS

| | | | |
|---|---|---|---|
| 2004/0239793 A1* | 12/2004 | Lu | H04N 5/2254 348/340 |
| 2005/0041098 A1* | 2/2005 | Tan | H05K 7/142 348/95 |
| 2005/0052568 A1* | 3/2005 | Tan | H01L 31/02325 348/374 |
| 2007/0077051 A1* | 4/2007 | Toor | G02B 13/0015 396/144 |
| 2007/0145242 A1 | 6/2007 | Toyoda et al. | |
| 2008/0083964 A1* | 4/2008 | Fujimoto | H01L 31/0203 257/432 |
| 2010/0134678 A1* | 6/2010 | Xu | G03B 17/00 348/340 |
| 2011/0157462 A1* | 6/2011 | Huang | H04N 5/2257 348/374 |
| 2014/0086536 A1* | 3/2014 | Shibuya | H01L 31/02325 385/88 |
| 2016/0028929 A1* | 1/2016 | Nakamura | H04N 5/2254 348/373 |

FOREIGN PATENT DOCUMENTS

| | | |
|---|---|---|
| JP | 2007-180653 A | 7/2007 |
| JP | 2007174358 A * | 7/2007 |

OTHER PUBLICATIONS

International Search Report dated May 30, 2017 for the International Application No. PCT/JP2017/015165.

* cited by examiner

F I G . 4
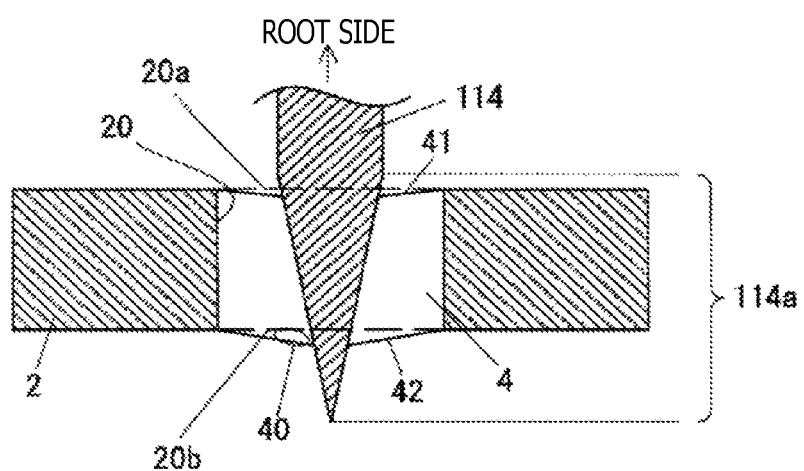

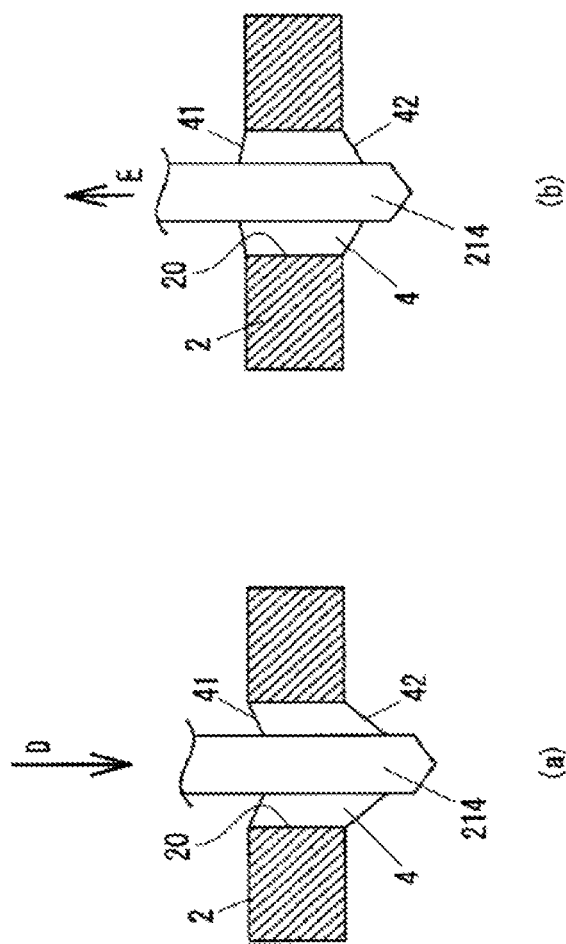

IMAGE PICKUP MODULE AND IMAGE PICKUP DEVICE

TECHNICAL FIELD

The present invention relates to an imaging module and an imaging apparatus.

BACKGROUND ART

As a configuration of an in-vehicle imaging apparatus including an imaging module, a configuration disclosed in, for example, Patent Document 1 is known. An imaging module disclosed in Patent Document 1 includes an imaging substrate on which an imaging element that converts light into an electrical signal is mounted and which has a through-hole; a lens member that condenses subject light on the imaging element; and a support pin that is bonded to the imaging substrate and to the lens member in a state of being inserted into the through-hole, and that fixes the imaging substrate to the lens member in an overlapping state at a predetermined gap kept between the lens member and the imaging substrate. Patent Document 1 also discloses that the support pin is bonded to the imaging substrate by a solder and that an adhesive such as a resin is also used for bonding the support pin.

PRIOR ART DOCUMENT

Patent Document

Patent Document 1: JP-2007-174358-A

SUMMARY OF THE INVENTION

Problem to be Solved by the Invention

However, with the configuration such that the support pin that is being inserted into the through-hole is bonded to the imaging substrate by the adhesive, unevenness in a coating shape of the adhesive causes expansion and contraction of the adhesive due to a temperature change or the like, possibly resulting in optical axis misalignment.

Means for Solving the Problem

An imaging module according to a first aspect of the present invention includes: a substrate on which an imaging element is mounted and in which a through-hole is formed; a holding section that has a support pin inserted into the through-hole in such a manner that the support pin penetrates the through-hole and that holds an optical system forming a subject image on the imaging element; and an adhesive that is provided in the through-hole and that fixes the substrate to the support pin, and at least a tip end portion of the support pin has a tapered shape from a root side of the support pin toward a tip of the support pin.

Effect of the Invention

According to the present invention, it is possible to reduce defocusing caused by expansion and contraction of the adhesive.

BRIEF DESCRIPTION OF THE DRAWINGS

FIG. 4 is an illustrative diagram of a support pin according to a first embodiment.

FIG. 9 shows diagrams illustrating an example of a method of forming an adhesive shape.

MODES FOR CARRYING OUT THE INVENTION

Embodiments of the present invention will be described hereinafter with reference to the drawings.

First Embodiment

Figure 1:
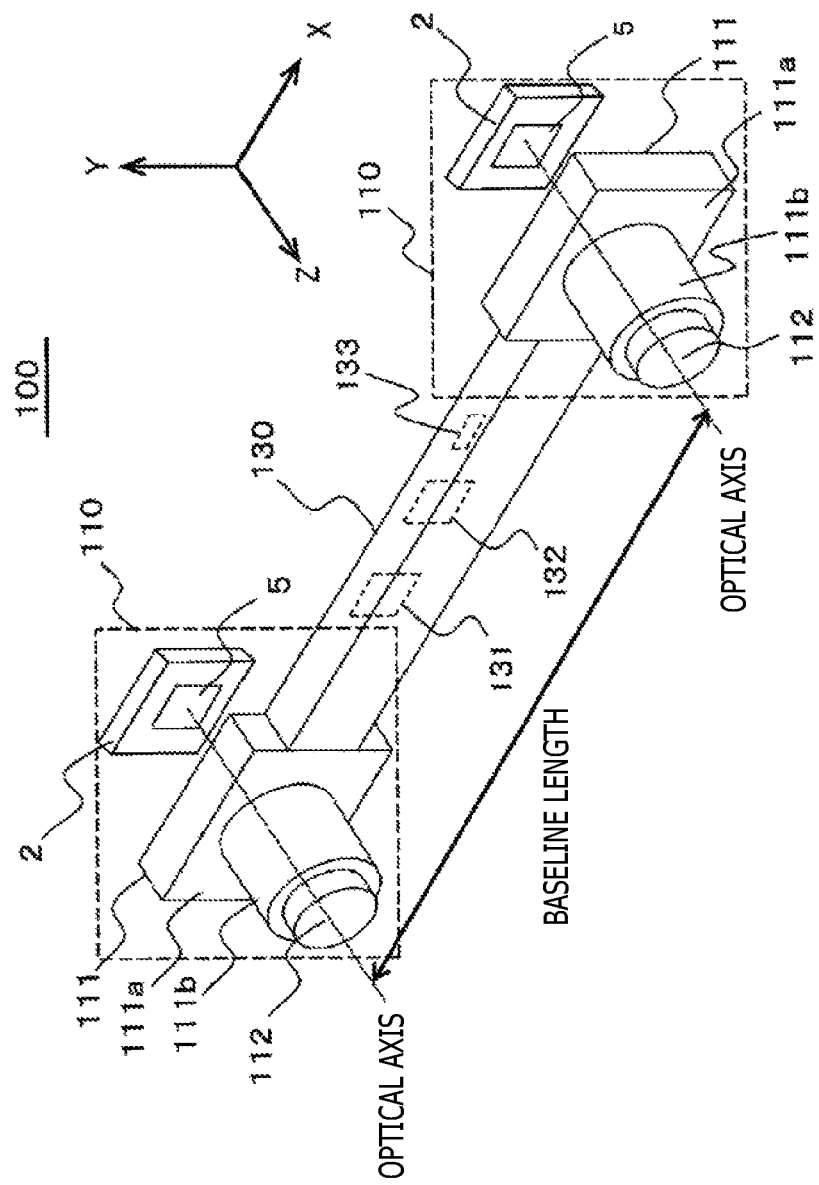
FIG. 1 is a diagram illustrating a schematic configuration of a multiple-lens imaging apparatus.

FIG. 1 is a diagram illustrating a schematic configuration of an in-vehicle multiple-lens imaging apparatus 100 that is an example of an imaging apparatus. This multiple-lens imaging apparatus 100 includes two imaging modules 110 on both ends of a center body 130. The two imaging modules 110 are installed at positions at which optical axes thereof are generally parallel to each other and which are apart from each other by a predetermined distance (baseline length). The multiple-lens imaging apparatus 100 can determine a distance to an object from a parallax between images obtained from the two imaging modules 110.

Module holders 111 of the imaging modules 110 are provided on both of the ends of the center body 130, respectively. Each module holder 111 includes a base section 111a and a cylindrical section 111b. A lens barrel 112 equipped with a lens is attached to the cylindrical section 111b. A substrate 2 on which an imaging element 5 and the like are loaded is fixed to a back surface of the lens barrel 112. The imaging element 5 is configured with a CCD, a CMOS, or the like.

An image processing IC 131, a microcomputer 132, a connector 133, and the like are provided in the center body 130. The image processing IC 131 transmits and receives various control signals and analog imaging signals to and from each of the imaging modules 110, converts the received analog imaging signals into digital signals, and calculates a distance to an imaged object, a magnitude, and the like. The microcomputer 132 is a control circuit that controls the image processing IC 131. The connector 133 supplies electric power and outputs a picked-up image and the like processed by the image processing IC 131 to an external device.

Figure 2:
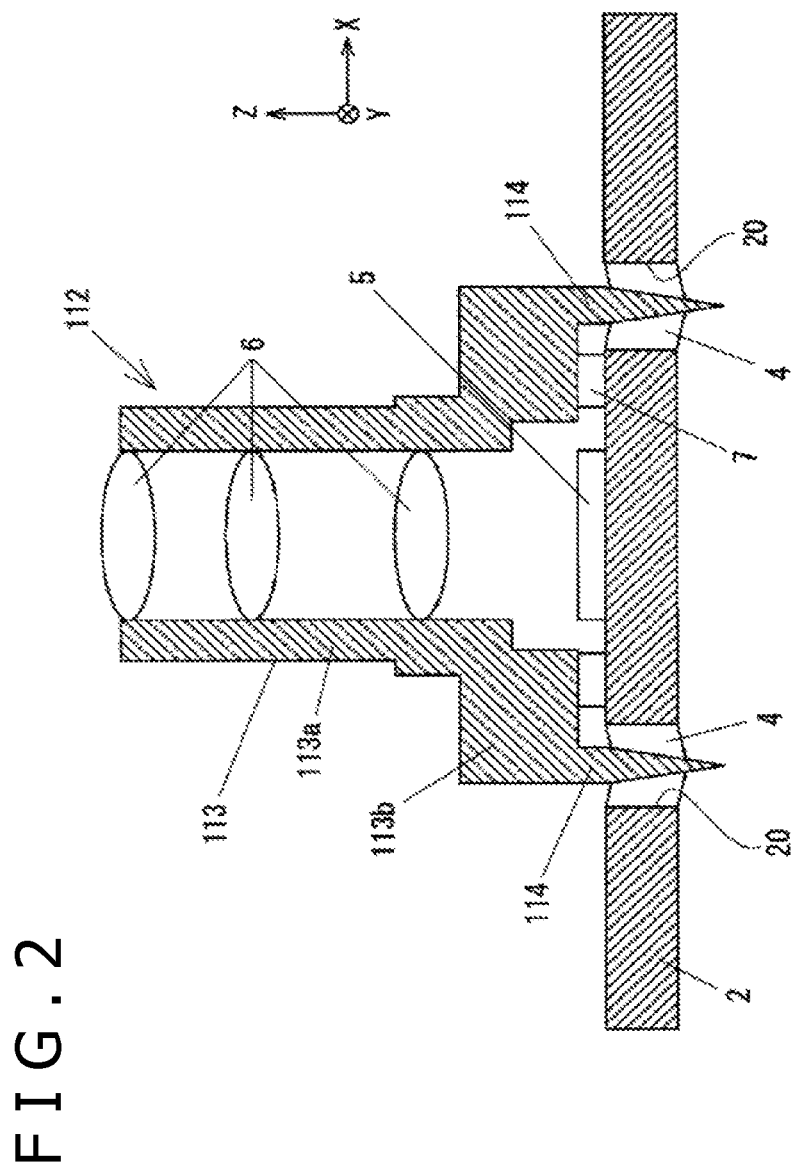
FIG. 2 is a cross-sectional view of an imaging module.

FIG. 2 is a cross-sectional view illustrating the lens barrel 112 and the substrate 2 of each imaging module 110. The lens barrel 112 includes one or more lenses 6 and a holding section 113 that holds the lenses 6. The holding section 113 includes a cylindrical section 113a and a base section 113b provided with support pins 114. The support pins 114 may be formed either integrally with or separately from the base section 113b. A through-hole 20 into which each support pin 114 is inserted is formed in the substrate 2 on which the imaging element 5 is loaded. Each support pin 114 and the substrate 2 are fixed to each other by an adhesive 4 provided in the through-hole 20. As the adhesive 4, an ultraviolet cure adhesive, for example, is used.

In work for adhesively fixing each support pin 114 to the substrate 2, the adhesive is coated to a portion in which the through-hole 20 is provided, a tip end of the support pin 114 is inserted into the through-hole 20, and a position of the lens barrel 112 relative to the substrate 2 is adjusted so that a focal point of each lens matches an imaging plane. In addition, after position adjustment, the portion in which the adhesive 4 is provided is irradiated with a UV ray to cure the adhesive 4.

It is noted that in an example illustrated in FIG. 2, an adhesive 7 besides the adhesive 4 is provided to surround the imaging element 5 in such a manner as to seal a clearance between the base section 113b and the substrate 2. This adhesive 7 is additionally coated after curing the adhesive 4 and enables maintenance of strength and further improvement of reliability.

In the embodiment illustrated in FIG. 2, the support pin 114 is characterized by a shape. First, conventional problems will be described with reference to a comparison of FIG. 3. Normally, in a case of a conventional imaging module, a support pin 214 is a columnar pin and a tip end face 214a is planar. In the present embodiment, after disposing the adhesive in the through-hole 20 of the substrate 2, the support pin 214 is inserted into the through-hole 20. In addition, a UV ray is radiated to cure the adhesive 4.

The support pin 214 is inserted into the through-hole 20 after the adhesive 4 is injected into the through-hole 20 without injecting the adhesive 4 into the through-hole 20 after inserting the support pin 214 into the through-hole 20 as in the conventional technique for the following reasons. With a configuration such that the adhesive 4 is injected into the through-hole 20 after inserting the support pin 214 into the through-hole 20, a restricted work space for injection work makes it quite difficult to conduct the injection work. This entails an increase in a manufacturing cost. Furthermore, since a clearance between the through-hole 20 and the support pin 114 is relatively small and the adhesive 4 relatively high in viscosity is injected into the clearance, the adhesive 4 can be injected only insufficiently and a cavity tends to be generated.

In a case of inserting the support pin 214 into the through-hole 20 after disposing the adhesive 4 in the through-hole 20 in this way and a tip end face 214a of the columnar support pin 214 is flat, then the adhesive within the through-hole 20 is pushed out by the tip end face 214a of the support pin 214 as illustrated in FIG. 3(b), and the adhesive 4 around the tip end face 214 is swollen on a rear side in such a way of being dragged. In other words, the adhesive 4 adheres to an entire tip end of the pin. As a result, a fillet 40 of the adhesive 4 is formed between the support pin 214 and the through-hole 20. Furthermore, as illustrated in FIG. 3(c), in a case in which the support pin 214 penetrates the portion in which the adhesive 4 is provided, then the adhesive 4 in a large quantity adheres onto the tip end face 214a, resulting in something of insufficiency of the adhesive 4 within the through-hole 20.

After the fillet 40 of the adhesive 4 is formed as illustrated in FIG. 3(b), a force indicated by arrows F1 and F2 is generated in an adhesive portion of the support pin 214 in a case in which the adhesive 4 contracts due to, for example, a reduction in an environmental temperature. The force becomes greater as the fillet 40 is larger, with the result that an amount of positional displacement of the support pin 214 in an axis direction grows and a problem of defocusing of an optical system occurs. In a case of a flat tip end as in the support pin 214, the adhesive 4 is pushed out by the tip end face 214a and the fillet 40 is formed in such a way as to be dragged and tends to be larger. Particularly if the adhesive 4 protrudes in such a way that a tip end portion of the support pin 214 is covered with the adhesive 4 as illustrated in FIG. 3(b), an amount of upward movement of the support pin 214 grows. Such movement of the support pin 114 also occurs when the adhesive 4 is cured. Conversely, in a case of expansion of the adhesive 4 due to an increase in the environmental temperature, a force opposite in direction to that in the case of contraction is generated to cause positional displacement of the lenses 6 in a direction of approaching the imaging element 5.

On the other hand, in a case illustrated in FIG. 3(c), an amount of the adhesive within the through-hole 20 decreases. As a result, there is a possibility that it is impossible to ensure an adhesive strength and to maintain reliability and that minute motions of the lenses resulting from the low strength cause optical axis misalignment.

FIG. 4 is an illustrative diagram of the support pin 114 of the imaging module 110. A tip end portion 114a of the support pin 114 is tapered from a root side of the pin toward a tip end of the pin. Specifically, the tip end portion 114a is of a conical shape narrower downward. Owing to this, an area of the tip end of the support pin 114 is smaller than that of the tip end of the support pin 214 illustrated in FIG. 3; thus, before a lower surface 42 of the adhesive 4 protrudes beyond a lower opening surface 20b of the through-hole 20, the tip end of the support pin 114 penetrates the adhesive 4.

As a result, it is possible to prevent the adhesive 4 from protruding to cover the tip end portion of the support pin 114 with the adhesive 4. It is also possible to suppress protrusion of the lower surface 42 of the adhesive 4 from the opening surface 20b, that is, reduce a magnitude of the fillet 40. As a result, a degree of dragging an upper surface 41 of the adhesive 4 into the through-hole 20 is also lowered. Therefore, it is possible to reduce an amount of movement of the support pin 114 either downward or upward in FIG. 4 due to expansion and contraction of the adhesive 4, compared with the conventional technique. The expansion and contraction of the adhesive occur due to a temperature change or a humidity change. However, providing a structure as illustrated in FIG. 4 makes it possible to reduce the amount of movement due to the temperature change or the humidity change; thus, even in a case in which a temperature of a product itself rises when the products operates, it is possible to suppress positional displacement of the support pin 114 in the adhesive portion. In other words, temperature characteristics of the product improve.

Figure 3:
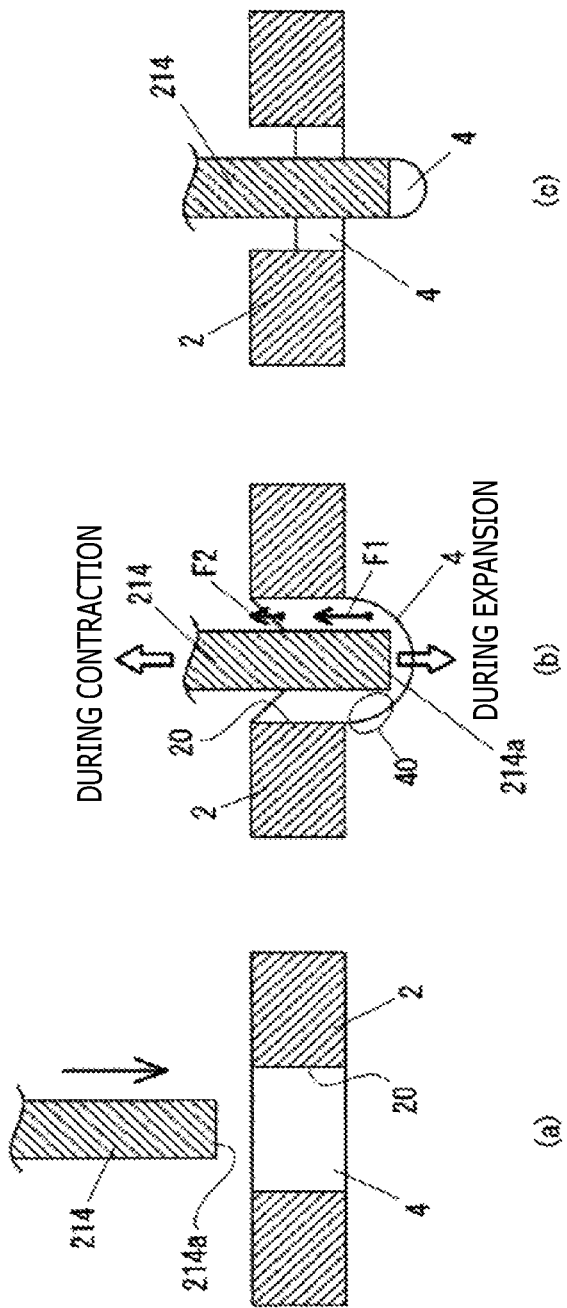
FIG. 3 shows illustrative diagrams of a comparison.
Figure 5:
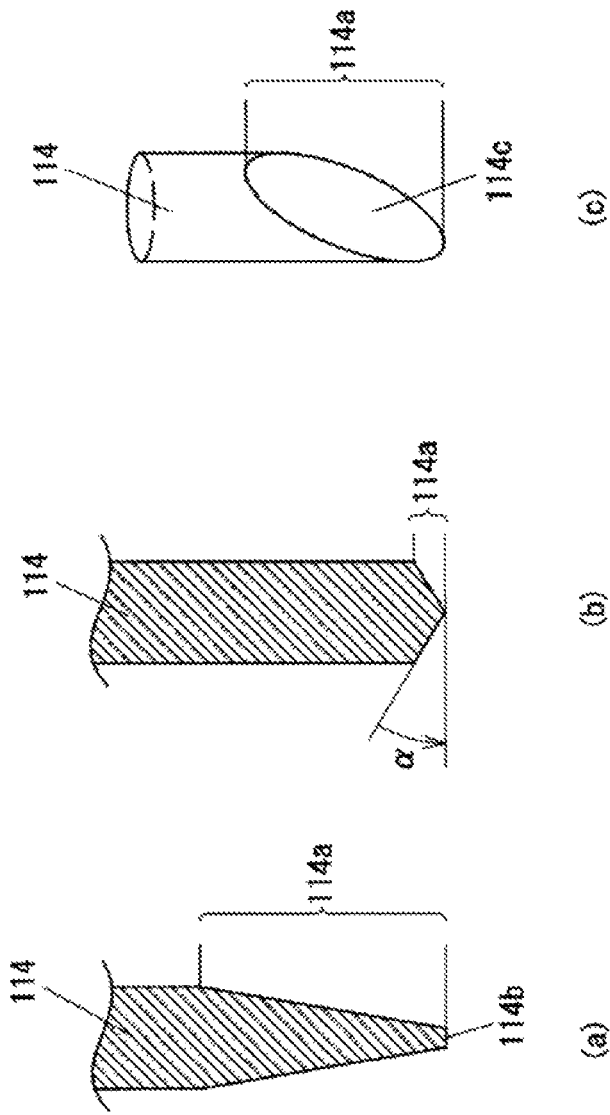
FIG. 5 shows diagrams illustrating other examples of a shape of the support pin.

The shape of the support pin 114 illustrated in FIG. 4 is an example of the tapered shape from the root side of the pin to the tip end of the pin and the shape of the support pin 114 may be, for example, shapes as illustrated in FIG. 5. In a case of the support pin 114 illustrated in FIG. 4 described above, the tip end of the tip end portion 114a is pointed. In a case of the support pin 114 illustrated in FIG. 5(a), the tip end of the tip end portion 114a is planar. In this case, it is similarly possible to sufficiently reduce an area of a tip end face 114b, compared with the tip end face 214a of the columnar support pin 214 illustrated in FIG. 3. As a result, the tip end of the support pin 114 easily penetrates the adhesive 4 and it is possible to prevent the tip end of the support pin 114 from being covered with the adhesive 4 as illustrated in FIG. 3(b). Moreover, the tip end of the support pin 114 penetrates the lower surface 42 of the adhesive 4 before the lower surface 42 largely protrudes downward; thus, it is possible to reduce the magnitude of the fillet 40, compared with a case of FIG.

3(b). As a result, it is possible to suppress axial displacement of the support pin 114 in the case of expansion and contraction of the adhesive 4.

In a case of the support pin 114 illustrated in FIG. 5(b), a height of the conical tip end portion 114a is reduced, compared with the case of FIG. 4. In this case, an angle α of the tip end portion is larger than that of the tip end portion of the support pin 114 illustrated in FIG. 4. However, the support pin 114 illustrated in FIG. 5(b) penetrates the adhesive 4 more easily than a columnar pin like the support pin 214; thus, it is similarly possible to prevent the tip end portion of the pin from being covered with the adhesive 4 and suppress the protrusion of the adhesive 4 from the opening surface 20b (refer to FIG. 4). As a result, it is possible to reduce axial movement of the support pin 114 in the case of expansion and contraction of the adhesive 4.

The support pin 114 illustrated in FIG. 5(c) has a shape such that the tip end portion 114a of the columnar support pin 114 is obliquely cut. A cut surface 114c is oval. In this case like above, the tip end portion 114a is tapered toward a tip end and the support pin 114 penetrates the adhesive 4 easily. Owing to this, it is possible to prevent the adhesive 4 from being formed to cover the tip end portion of the pin with the adhesive 4, suppress the protrusion of the adhesive 4 from the opening surface 20b (refer to FIG. 4), and reduce the axial displacement of the support pin 114 accompanying expansion and contraction of the adhesive 4.

Figure 6:
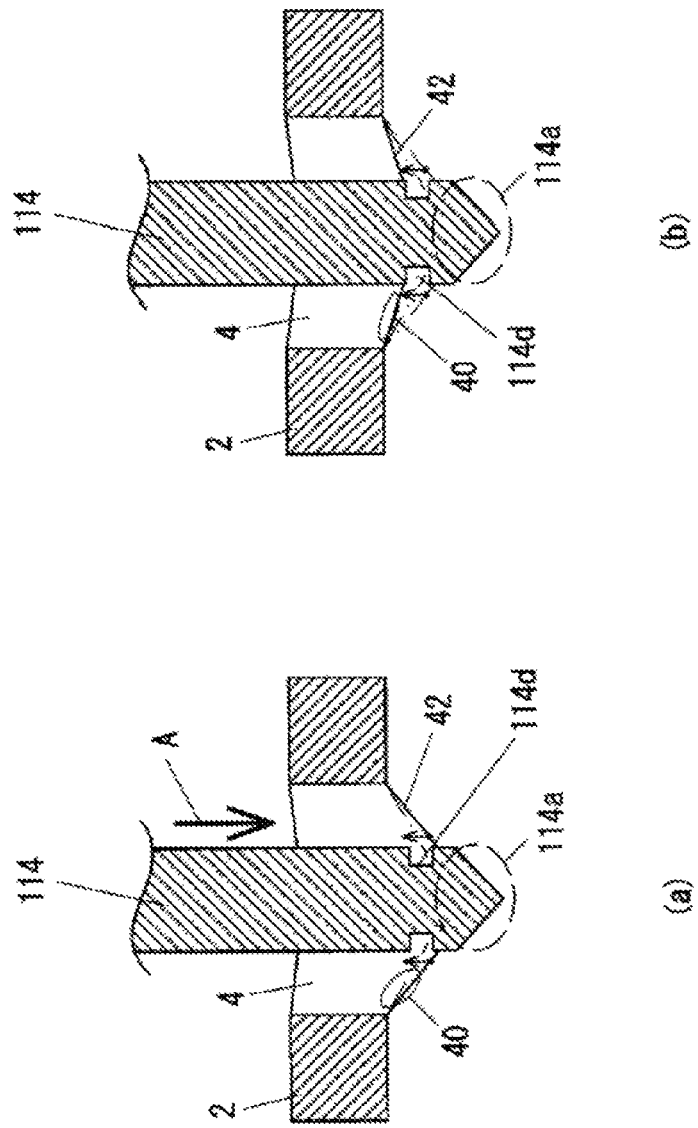
FIG. 6 shows diagrams illustrating a modification of the support pin.

FIG. 6 shows diagrams illustrating a modification of the support pin 114. The support pin 114 illustrated in FIG. 6 is obtained by forming a ring groove 114d in the support pin 114 illustrated in FIG. 5(b). When the support pin 114 is pushed down in the figure as indicated by an arrow A, then the tip end portion 114a penetrates the adhesive 4, the lower surface 42 of the adhesive 4 is turned into a state of being swollen downward, and the fillet 40 is formed.

When the support pin 114 is pushed down further from this state, a force to return upward while being dragged downward acts on a portion in which the fillet 40 is formed. At this time, if the groove 114d is formed on a peripheral surface of the support pin 114, a diameter is sharply reduced in this portion; thus, a force of the adhesive to adhere to the support pin 114 weakens and the lower surface 42 is easier to move upward as illustrated in FIG. 6(b). As a result, the portion in which the fillet 40 is formed is made smaller and it is possible to suppress the axial movement of the support pin 114 at the time of expansion and contraction of the adhesive 4.

Figure 7:
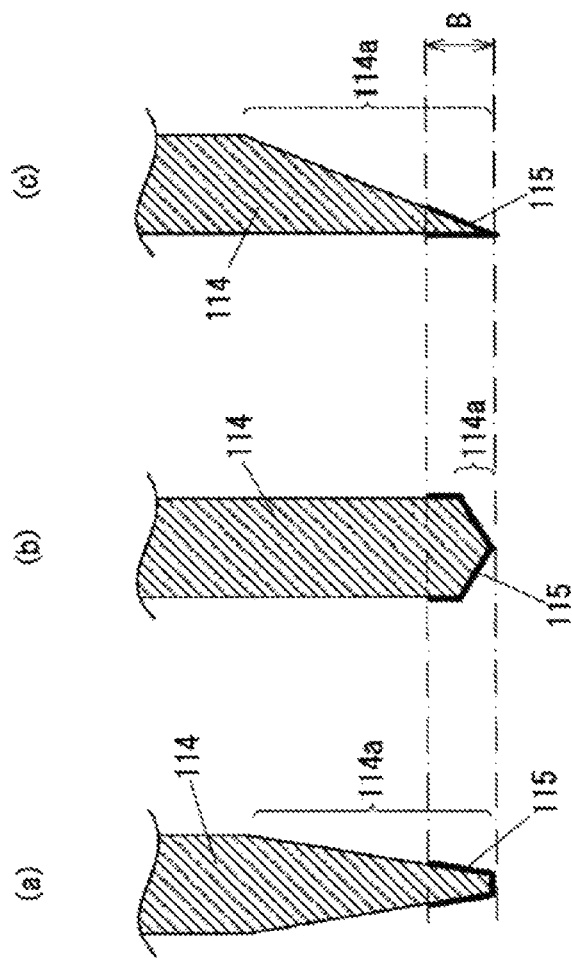
FIG. 7 shows diagrams illustrating other modifications of the support pin.

FIG. 7 shows diagrams illustrating other modifications. FIG. 7 shows diagrams illustrating cross-sections of the support pin 114, and cross-sectional shapes of (a) to (d) correspond to cross-sectional shapes of the support pin 114 illustrated in (a) to (c) of FIG. 5. In the modification illustrated in FIG. 7, a film 115 that prevents adhesion of the adhesive 4 is further formed in at least a portion of the tip end portion 114a including the tip end of the support pin 114. In examples of FIG. 7, the film 115 is formed in a range indicated by a symbol B.

In this way, forming the film 115 made of a low wettability substance that prevents the adhesion of the adhesive 4 in the range B makes it difficult for the adhesive 4 to adhere to this portion. As a result, it is possible to further reduce the magnitude of the fillet 40 illustrated in FIG. 4 and suppress the axial movement of the support pin 114 accompanying expansion and contraction of the adhesive 4.

While various types of materials may be used for the film 115 and examples of the materials include a fluororesin, an acrylic resin, a urethane resin, and a melamine resin, any material that can repel the adhesive 4 can be used. Furthermore, as a method of forming the film 115, an ordinary surface treatment such as coating, a plasma treatment, or an ozone treatment is considered to be available.

As described above, according to the first embodiment, the imaging module 110 includes: the substrate 2 on which the imaging element 5 is mounted and in which the through-hole 20 is formed; the holding section 113 that has the support pin 114 inserted into the through-hole 20 in such a manner that the support pin 114 penetrates the through-hole 20 and that holds the lenses 6 forming a subject image on the imaging element 5; and the adhesive 4 that is provided in the through-hole 20 and that fixes the substrate 2 to the support pin 114, and at least the tip end portion 114a of the support pin 114 has the tapered shape from the root side of the support pin 114 toward the tip end of the support pin 114.

Forming the tip end portion 114a of the support pin 114 into the tapered shape smaller toward the tip end in this way makes it easy for the tip end portion 114a to penetrate the adhesive 4. It is thereby possible to avoid a situation in which a region including the tip end of the support pin 114 is covered with the adhesive 4 as illustrated in FIG. 3(b), and reduce the fillet 40 of the adhesive 4 formed in a range from the support pin 114 to an edge of the through-hole 20. As a result, it is possible to reduce the axial movement of the support pin 114 due to expansion and contraction of the adhesive 4.

Moreover, as illustrated in FIG. 7, it is preferable to form the film (for example, fluororesin film) 115 that prevents the adhesion of the adhesive 4 in at least a portion including the tip end of the tip end portion 114a of the support pin 114. It is thereby possible to further enhance an effect of preventing the tip end of the support pin 114 from being covered with the adhesive 4 and reduce the axial movement of the support pin 114 due to expansion and contraction of the adhesive 4.

Furthermore, while the holding section 113 and the support pins 114 are formed integrally in the configuration illustrated in FIG. 2, the holding section 113 and the support pins 114 may be formed separately. For example, integrally molding the holding section 113 and the support pin 114 by a resin or the like can contribute to cost reduction.

It is noted that configuring the imaging module 110, as illustrated in FIG. 2, such that the adhesive 7 is provided in such a manner as to surround the imaging element 5 in a state in which the support pin 114 is inserted into the through-hole 20 and adhesively bonded to the substrate 2 as described above makes it possible to reduce the amount of the positional displacement of the support pin 114 in the axial direction after a reliability test and the amount of the temperature-dependent positional displacement in the axial direction. Moreover, even in a case in which the position of the support pin 114 is displaced from a center of the through-hole 20 at a time of curing the adhesive 4, not only adhesive bonding to the substrate 2 using the support pin 114 but also use of the adhesive 7 makes it possible to suppress the positional displacement of the support pin 114 in a substrate planar direction or the axial direction; thus, the temperature characteristics and the positional displacement after the reliability test are not affected.

Second Embodiment

Figure 8:
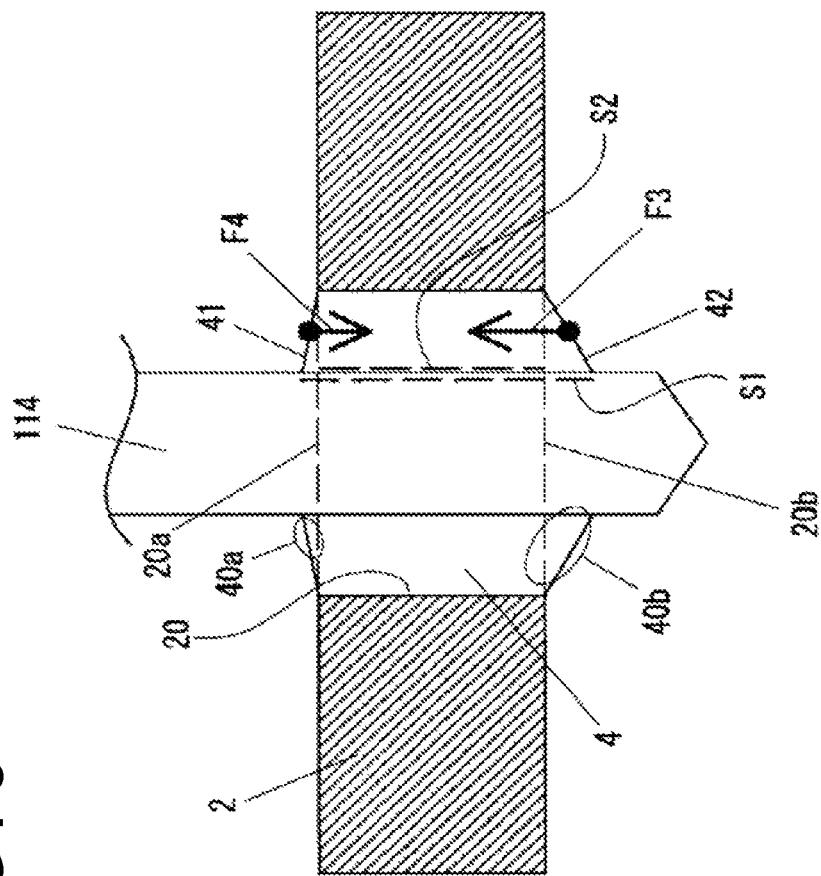
FIG. 8 is an illustrative diagram of a second embodiment.

FIG. 8 is an illustrative diagram of a second embodiment and illustrates a fixing portion (adhesive portion) in which the support pin 114 is fixed (adhesively bonded) to the substrate 2. It is noted that a shape of the support pin 114 is similar to that illustrated in FIG. 5(b). Owing to this, the tip end portion of the support pin 114 penetrates the lower surface 42 of the adhesive 4 and the tip end of the support pin 114 is not covered with the adhesive 4. Furthermore, in an example illustrated in FIG. 8, the adhesive 4 not only protrudes downward from the lower opening surface 20*b* in FIG. 8 but also protrudes upward from an upper opening surface 20*a* in FIG. 8. In other words, fillets 40*a* and 40*b* are formed outside of the opening surfaces 20*a* and 20*b*. In other words, comparing a contact area S1 of the adhesive 4 on an outer peripheral surface of the support pin 114 with a projection area S2 in a case of projecting a cross-section of the substrate 2 onto the outer peripheral surface of the support pin 114 leads to S1>S2.

As described above, with the presence of the fillets 40*a* and 40*b* on upper and lower sides of the adhesive 4, forces of the fillets 40*a* and 40*b* acting on the adhesive portion during expansion and contraction of the adhesive 4 are opposite in direction. In other words, as illustrated in FIG. 8, in a case of contraction of the adhesive 4, a direction a force F3 of the lower fillet 40*b* is an upward direction in FIG. 8 and that of a force F4 of the fillet 40*a* is a downward direction in FIG. 8. On the other hand, in a case of expansion of the adhesive 4, the directions of the forces are reversed. In either case, the forces F3 and F4 are in the directions in which the forces F3 and F4 cancel each other; thus, it is possible to reduce the axial movement of the support pin 114 in the case of expansion and contraction of the adhesive 4. For example, when magnitudes of the fillets 40*a* and 40*b* are equal, the amount of movement=0 computationally.

Moreover, since the adhesive 4 spreads outside of a region put between the opening surfaces 20*a* and 20*b* with respect to the support pin 114, an adhesive area increases and the adhesive strength grows. The higher adhesive strength enables an increase in resistance to temperature, humidity, and impact, thereby making it possible to ensure long-term reliability.

FIG. 9 illustrates an example of a method of forming an adhesive shape as illustrated in FIG. 8. First, the adhesive 4 is disposed in the through-hole 20 of the substrate 2. Next, as illustrated in FIG. 9(*a*), the support pin 114 is inserted into the through-hole 20 in an arrow D direction and the support pin 114 is moved downward until the tip end portion of the support pin 114 penetrates the lower surface 42 of the adhesive 4. At this time, the upper surface 41 of the adhesive 4 has a shape recessed in the through-hole 20 while the lower surface 42 has a shape protruding downward from the through-hole 20.

Next, as illustrated in FIG. 9(*b*), the support pin 114 is moved in a direction of pulling out the support pin 114, that is, an arrow E direction. The adhesive 4 is then dragged upward in FIG. 9(*b*), the upper surface 41 protrudes upward from the through-hole 20, and an amount of protrusion of the lower surface 42 decreases. Subsequently, a position of the lens barrel 112 in x-axis and y-axis directions and a position thereof in a z-axis direction (optical axis direction) in FIG. 2 are adjusted for optical axis alignment between the optical system and the imaging element 5 and focus adjustment.

As described so far, according to the second embodiment, as illustrated in FIG. 8, the support pin 114 is inserted into the through-hole 20 in such a manner as to penetrate the through-hole 20 from one opening surface 20*a* to the other opening surface 20*b*, one portion of the adhesive 4 provided in the through-hole 20 protrudes outside of the through-hole beyond the opening surface 20*a*, and another portion thereof protrudes outside of the through-hole beyond the opening surface 20*b*. Owing to this, during expansion and contraction of the adhesive 4, the direction of the force acting on the support pin 114 from the adhesive 4 provided on the opening surface 20*a* side is opposite to the direction of the force acting on the support pin 114 from the adhesive 4 provided on the opening surface 20*b* side. As a result, it is possible to reduce the movement of the support pin 114 in the optical axis direction accompanying expansion and contraction of the adhesive 4.

While various embodiments and various modifications have been described above, the present invention is not limited to contents of these embodiments and modifications. Other possible aspects within the scope of the technical concept of the present invention are also contained in the scope of the present invention.

A disclosure content of the following priority application is incorporated herein by reference.

Japanese Patent Application No. 2016-089030 (filed Apr. 27, 2016)

DESCRIPTION OF REFERENCE CHARACTERS

4, 7: Adhesive
5: Imaging element
6: Lens
40, 40*a*, 40*b*: Fillet
100: Multiple-lens imaging apparatus
110: Imaging module
112: Lens barrel
113: Holding section
114, 214: Support pin
114*a*: Tip end portion
115: Film

The invention claimed is:

1. An imaging module comprising:
    a substrate on which an imaging element is mounted and in which a through-hole is formed;
    a holding section that has a support pin inserted into the through-hole in such a manner as to penetrate the through-hole, and that holds an optical system forming a subject image on the imaging element; and
    an adhesive that is provided in the through-hole and that fixes the substrate to the support pin, wherein
        at least a tip end portion of the support pin is of a tapered shape from a root side of the support pin toward a tip end of the support pin,
        the support pin is inserted into the through-hole in such a manner as to penetrate the through-hole from a first opening surface that is one of opening surfaces to a second opening surface that is an other opening surface,
        a first portion of the adhesive protrudes outside of the through-hole beyond the second opening surface,
        on the second opening surface, the support pin penetrates through the first portion of the adhesive and protrudes past the first portion of the adhesive, and
        a second portion of the adhesive provided in the through-hole is recessed into the first opening surface, such that a portion of the second portion that is in contact with the substrate extends past an other portion of the second portion that is in contact with the support pin, and a gap is provided between the first opening surface and the second portion.

2. The imaging module according to claim 1, further comprising
    an adhesive that is disposed around the imaging element and that fixes the holding section to the substrate.

3. The imaging module according to claim 1, wherein
    a film that prevents adhesion of the adhesive is formed in at least a portion including a tip end of the tip end portion.

4. The imaging module according to claim 1, wherein the holding section and the support pin are formed integrally by a resin.

5. The imaging module according to claim 1, wherein a plurality of support pins are in the substrate,
a first fillet is formed between the first portion of the adhesive and the second portion of the adhesive and protrudes outside of the through-hole beyond the second opening surface and outside of the through-hole beyond the first opening surface, and
a second fillet is formed between the first opening surface and the second opening surface.

6. The imaging module according to claim 5, wherein a contact area of the first fillet is greater than a contact area of the second fillet.

7. An imaging apparatus including the imaging module according to claim 1.

\* \* \* \* \*